United States Patent [19]
Chen

[11] Patent Number: 6,087,586
[45] Date of Patent: Jul. 11, 2000

[54] CHIP SCALE PACKAGE

[75] Inventor: Shih-Li Chen, Hsinchu Hsien, Taiwan

[73] Assignee: Caesar Technology, Inc., Hsinchi Hsien, Taiwan

[21] Appl. No.: 09/055,750

[22] Filed: Apr. 7, 1998

[30] Foreign Application Priority Data

May 13, 1997 [TW] Taiwan ................................. 86207718

[51] Int. Cl.$^7$ ................................................. H01L 23/48
[52] U.S. Cl. ........................ 174/52.4; 257/693; 257/712; 257/713
[58] Field of Search ................................. 174/52.2, 52.3, 174/52.4; 257/705, 712, 713, 693

[56] References Cited

U.S. PATENT DOCUMENTS

| | | | |
|---|---|---|---|
| 4,864,079 | 9/1989 | Barlow | 174/52.1 |
| 5,206,794 | 4/1993 | Long | 257/675 |
| 5,403,975 | 4/1995 | Pasqualoni et al. | 174/52.4 |
| 5,592,022 | 1/1997 | Richards et al. | 257/735 |
| 5,640,045 | 6/1997 | Krause, III | 257/705 |
| 5,760,471 | 6/1998 | Fujisawa et al. | 257/692 |
| 5,920,458 | 7/1999 | Azar | 361/704 |

*Primary Examiner*—Kristine Kincaid
*Assistant Examiner*—W. David Walkenhorst
*Attorney, Agent, or Firm*—Rosenberg, Klein & Lee

[57] ABSTRACT

A chip scale package for packaging an IC chip includes a package frame displaced from the side and bottom surfaces of the IC chip by a predetermined gap and a pair of leads symmetrically extending in opposite directions. Each lead has an inner lead portion coupled to a bonding point on the top surface of the IC chip, and an outer lead portion bent and contoured in such a way that to follow the shape of the outside surface of the package frame. The lead further includes a connecting segment extending between the inner lead portion and the outer lead portion. Under heat induced stress, an angle between the connecting segment and the wall of the package frame changes causing displacement of the IC chip from its original position, and the gap between the surfaces of the IC chip and the package frame absorbs deviations in position of the IC chip, to cushion the stress effect.

7 Claims, 3 Drawing Sheets

CHIP SCALE PACKAGE

FIELD OF THE INVENTION

The invention generally relates to an integrated circuit (IC) package, and particularly to a chip scale package of semiconductor device.

BACKGROUND OF THE INVENTION

Conventionally when packaging a semiconductor device, each bonding point of the IC chip to be packaged is connected with an inner lead through a bonding wire (such as a gold wire). Because each outer lead which is an extension of an inner lead can be welded into a connection point of a circuit board, a signal path can thus be built to conduct signal between a bonding point of the packaged IC chip and a corresponding connecting point of the circuit board. To prevent the bonding wire from being touched or hurt, encapsulant such as epoxy is used to cover the top of the IC chip. Due to possible existence of internal stress caused by the difference in coefficient of thermal expansion, a conventional IC package which usually lacks stress buffer capability tends to crack easily or to have its bonding wire broken away from its bonding point, resulting in bad application reliability of the IC. An IC chip without proper protection for either itself or its leads will likely be hurt or damaged by external force inherent in production process or shipping process, resulting in high failure rate of the IC. A conventional IC package with leads often deformed by external force or pressure needs work to recover the normal position of its leads, or to put its leads in order before welding them into another device such as a circuit board, leading to waste of labor and time in applying the IC. It can be seen now that there are disadvantages inherent in a conventional IC package structure, and there's a need of developing a new structure for overcoming these disadvantages.

SUMMARY OF THE INVENTION

The object of the present invention is to provide a new IC package structure with thin and super-mini size, and with features for overcoming the disadvantages inherent in a conventional IC package structure.

Another object of the present invention is to provide a new IC package structure allowing an IC package to be used for IC chip of various sizes, and therefore allowing lower production/storage cost.

A chip scale package structure based on the present invention for packaging an IC chip, is characterized by that:

surrounding the IC chip by a package frame with a gap left between the IC chip and the package frame, connecting (through a bonding wire and an inner lead, for example) at least a pair of bonding points of the IC chip individually to at least two outer leads both extending in opposite directions along the outer surface of the package frame, the package frame being prevented from moving beyond an assigned region by the outer leads, thereby the outer leads can be welded by approaching the top, side, and bottom outer surface of the package frame, whereby better adaptability of the chip scale package to various applications can be realized.

Another version of the chip scale package structure based on the present invention for packaging an IC chip, is characterized by that:

surrounding the IC chip by a package frame with a gap left between the IC chip and the package frame, extending at least two outer leads in opposite directions along the outer surface of the package frame, and connecting individually at least a pair of bonding points of the IC chip to the outer leads through a line (a bonding point through a line to a corresponding outer lead) comprising a slanted connecting segment (and possibly a bonding wire as well as an inner lead). The slanted connecting segment has an upper end connected to the outer lead and a lower end connected to the bonding point. The connecting segment is angled with respect to the connection point (right beside the top outer surface of the package frame) between the connecting segment and the outer lead, thereby the gap and the angle can change with stress, whereby the chip scale package can cushion (buffer) a stress, particularly the stress resulting from a difference in coefficient of thermal expansion/shrinkage between the IC chip and the package frame. It must be noted that the package frame's top surface beside which the connecting segment is connected with the outer lead is in a position above the bonding point, therefore the connecting segment is slant with an angle to the outer lead. Obviously the package frame can be prevented from moving beyond an assigned region as long as the outer leads extend throughout the outer surface of the package frame (including the part hooking upward under the IC chip).

A further version of the chip scale package structure based on the present invention for packaging an IC chip, is characterized by that:

surrounding the IC chip by a package frame with a gap left between the IC chip and the package frame, extending at least two outer leads in opposite directions along the outer surface of the package frame, and connecting individually at least a pair of bonding points of the IC chip to the outer leads through a bonding wire, an inner lead, and a connecting segment (a bonding point through a bonding wire, an inner lead, and a connecting segment to an outer lead), the inner lead lying above the IC chip, the connecting segment being slant with upper end thereof connecting the outer lead and lower end thereof connecting the inner lead. Obviously the chip scale package structure can be so configured that the package frame's top surface beside which the connecting segment is connected with the outer lead is in a position above the inner leads, therefore the connecting segment is slant with an angle to the outer lead.

A chip scale package for packaging an IC chip may be configured to comprise:

a package frame surrounding the IC chip with a gap between the package frame and the IC chip; and at least two outer leads connected to bonding points of the IC chip, extended in opposite directions along the outer surface of the package frame, and preventing the package frame from moving beyond an assigned region.

A chip scale package based on the present invention for packaging an IC chip, may also be configured to comprise: a package frame surrounding the IC chip with a gap between the package frame and the IC chip; at least two outer leads extending in opposite directions along the outer surface of the package frame; and a connecting segment being slant with upper end thereof connecting the outer lead and lower end thereof connected to a bonding point of the IC chip. Here the connecting segment may be connected to the bonding point through an inner lead which is above the top surface of the IC chip while in a position lower than the top outer surface of the package frame. Here the connecting segment may also be connected to the bonding point through an inner lead and a bonding wire, the inner lead is above the top surface of the IC chip while in a position lower than the top outer surface of the package frame.

The package frame may be made of material with high electrical conductivity, and may have its surface processed for electrical insulation, thereby the induction of the outer lead can be lowered.

The package frame may also be made of material with high heat dissipation capability, thereby the heat generated by the IC chip can be easily dissipated. The outer lead's end which is under the IC chip may be configured to hook against the package frame to prevent the package frame from moving beyond an assigned region. It may also be configured to just hook upward to prevent the package frame from moving beyond an assigned region.

It can be seen the slant angle of the connecting segment can change with a stress, thereby the chip scale package can cushion a stress.

The chip scale package according to the present invention may also be configured to further comprise material covering the top surface of the IC chip, thereby the bonding wire and the bonding points can be protected.

It must be noted the chip scale package based on the present invention may be so configured that the magnitudes of the gap and the angle are in such a range that a stress caused by a difference in coefficient of thermal expansion/shrinkage between the IC chip and the package frame can be perfectly cushioned.

The present invention may best be understood through the following description with reference to the accompanying drawings, in which:

DETAILED DESCRIPTION OF PREFERRED EMBODIMENTS

Figure 1:
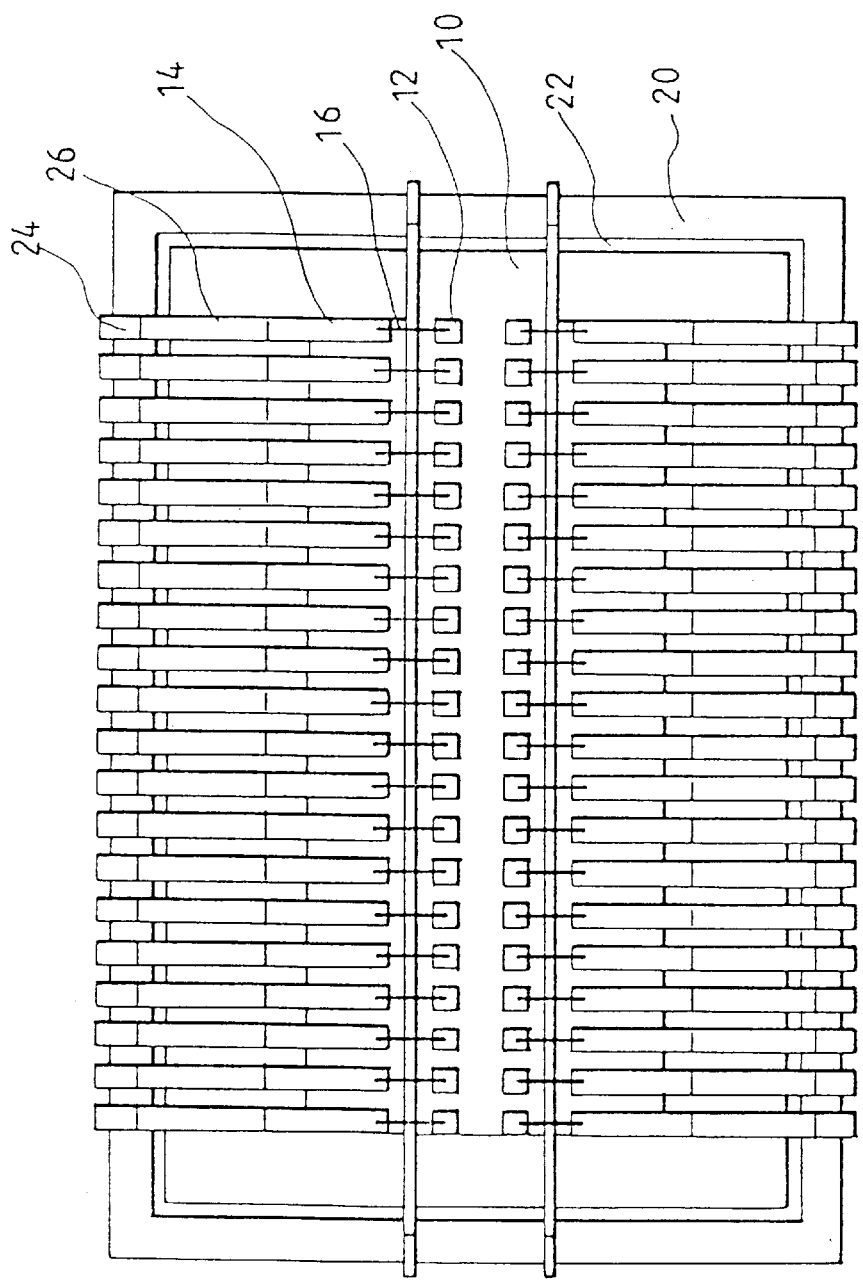
FIG. 1 is a top view of an embodiment based on the present invention.
Figure 2:
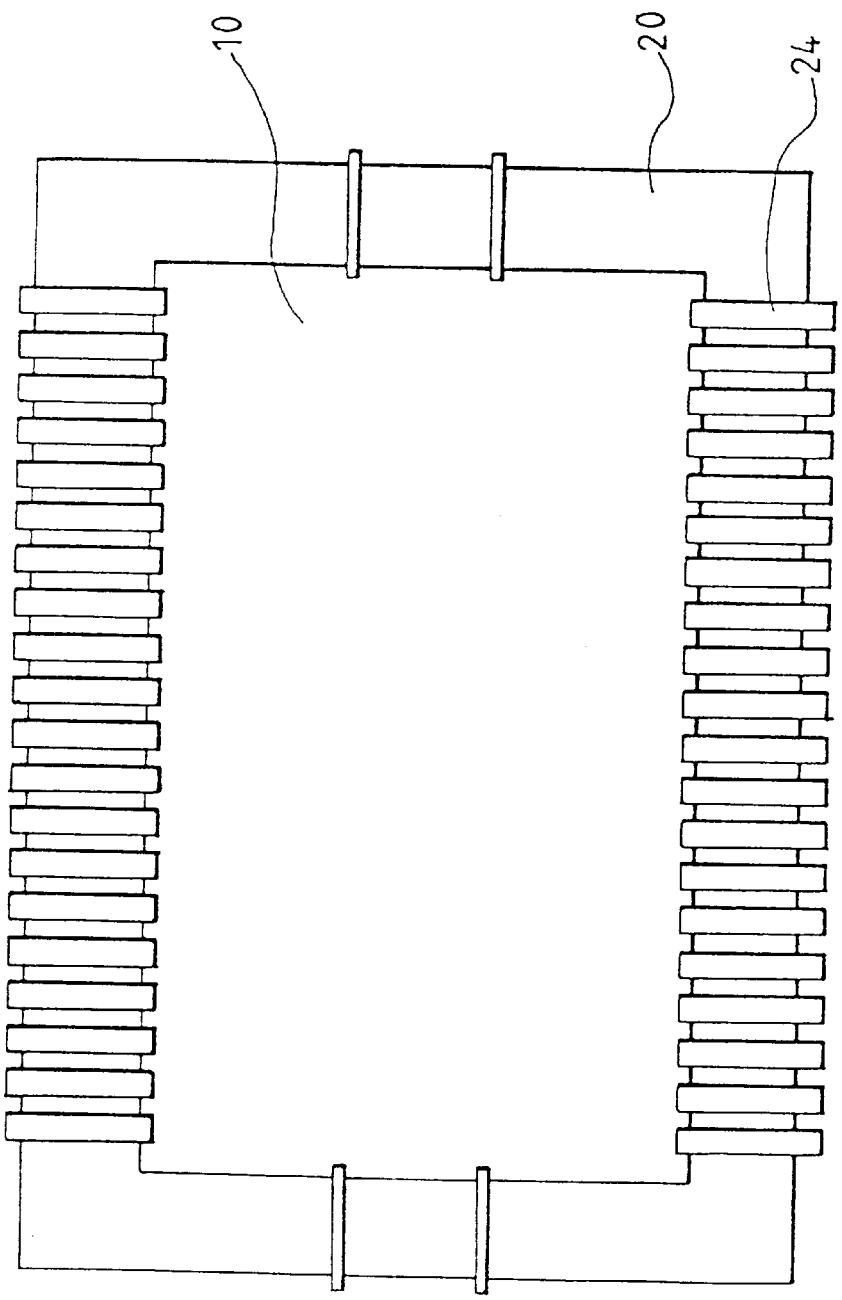
FIG. 2 is a bottom view of an embodiment based on the present invention.
Figure 3:
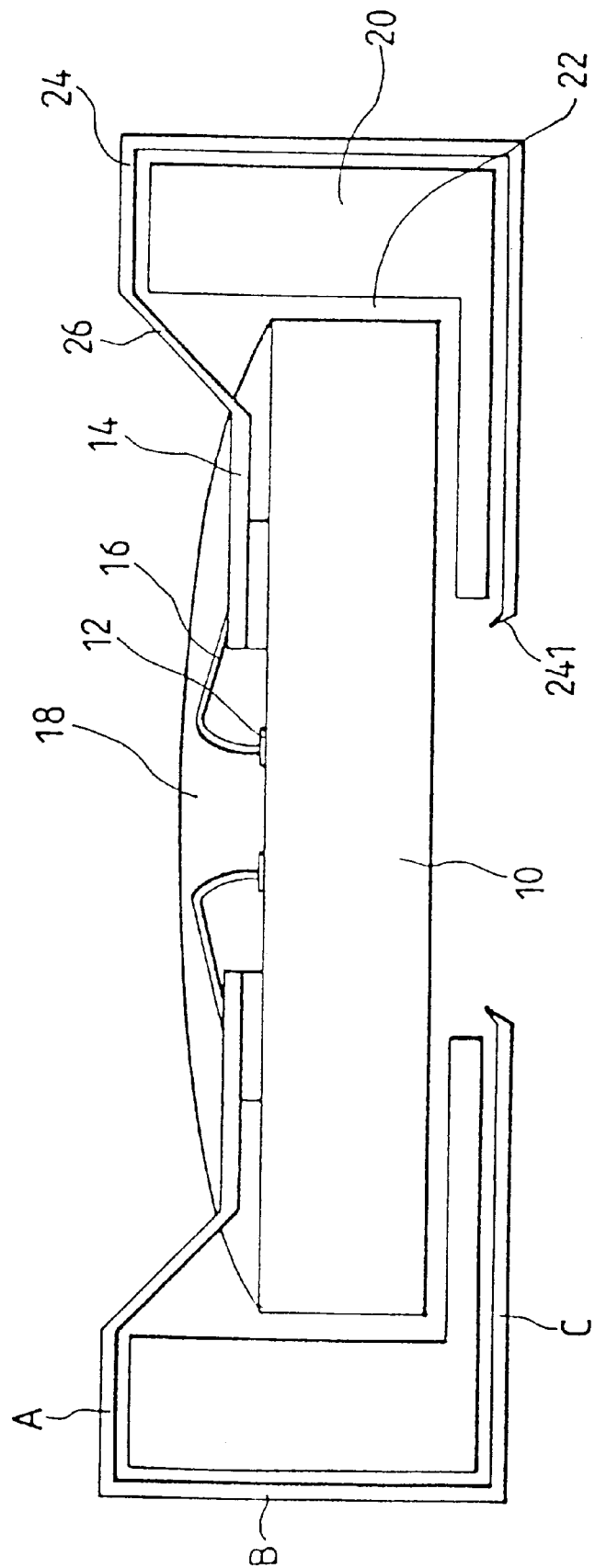
FIG. 3 is a side view of an embodiment based on the present invention.

A preferred embodiment of the chip scale package based on the invention is illustrated by FIG. 1, FIG. 2, and FIG. 3. As shown in these figures, the bonding points 12 on the top of IC chip 10 are connected with inner lead 14 through bonding wires 16 (such as gold wires). Material such as epoxy 18 is used to cover the top of IC chip 10 for preventing bonding 16 wires from being damaged in production processing or product application phase. IC chip 10 is surrounded by a package frame 20 with a gap 22 between them (between IC chip 10 and package frame 20). Package frame 20 is made of material with high electrical conductivity and heat dissipation capability, and has its surface processed for insulation capability, resulting in good heat dissipating for an operating IC chip, and lower induction for outer lead 24, and consequently higher operating reliability and better quality of signal communication can be achieved. Inner lead 14 and outer lead 24, connected by a connecting segment 26, can be deemed an element in spite of different names assigned for the reason they are differently located. Connecting segment 26 is configured to slant, with upper end connected with outer lead 24 and lower end connected with inner lead 14. Outer lead 24 extends along the outer surface of package frame 20 (of course bends according to the shape of package frame 20), and ends under IC chip 10 with a hook-like element 241 to hook upward for fixing package frame 20 (to hook the end of the part of package frame 20 which is under IC chip 10, for example), or for limiting package frame 20 to an optimum working position (or region). With outer lead 24 extending along the top, side, and bottom face of package frame 20, A (top segment of outer lead 24), B (side segment of outer lead 24), and C (bottom segment of outer lead 24) are available for welding, thereby an IC package so configured can adapt to various applications in which different portions of an IC package is to be selected for welding operation.

As long as package frame 20 is made to be of high mechanical strength (capable of withstanding pressure or stress, for example) and with surface flat enough, IC chip 10 can be protected from damage possibly caused in each production phase as well as shipping phase. Supported by package frame 20, outer lead 24 can resist high pressure in testing, and welding processes. Pressure may be exerted on A (top segment of outer lead 24), B (side segment of outer lead 24), and C (bottom segment of outer lead 24) of outer lead 24 to make them stick evenly to the surface of package frame 20, thereby to realize a perfect contact between outer lead 24 and the face of an object whenever necessary. Obviously either A (top segment of outer lead 24), or B (side segment of outer lead 24), or C (bottom segment of outer lead 24) of all outer leads 24 can be easily adjusted to be on the same plane (all outer leads 24 with A on the same plane, with B on another plane, for example), to achieve optimum contacting between outer lead 24 and the object to be welded. It is clear the chip scale package structure based on the present invention can solve a troublesome problem that a conventional IC package hardly has its all package leads lying on the same plane. The pressure exerted on A (top segment of outer lead 24), B (side segment of outer lead 24), and C (bottom segment of outer lead 24) of outer lead 24 can be prevented from reaching IC chip 10 according to the structure (gap 22 contributes to this effect, for example). It can be seen now the chip scale package structure based on the invention provides an IC package with high reliability, pressure resistance, and significant convenience of welding operation for various applications. The gap 22 between IC chip 10 and package frame 20, together with the connecting segment 26 which slants with an angle and connects with inner lead 14 and outer lead 24, function as a stress buffer mechanism, because the position (height, for example) of IC chip 10 can adapt to the effect of thermal expansion/shrinkage through changing the slant angle of connecting segment 26, thereby the stress caused by the effect of thermal expansion/shrinkage can be buffered (lowered), whereby an IC package of such a structure can be applied wherever high reliability is required.

The fact that the structure based on the invention can provide an IC package with resistance to thermal expansion stress resulting from thermal coefficient difference is further described as follows.

Suppose the thermal coefficient of package frame 20 is bigger than IC chip 10, and IC chip 10 generates heat when operating, package frame 20 will expand outward more than IC chip 10 then (magnitude of expansion size of package frame 20 is bigger than that of IC chip 10), resulting in smaller slant angle of connecting segment 26 connecting inner lead 14 and outer lead 24, consequently leading to moving of IC chip 10 upward, and buffer (or cushioning) for stress; when IC chip 10 cools as a result of being idle (not operating), package frame 20 shrinks inward more than IC chip 10 then (magnitude of shrinkage of package frame 20 is bigger than that of IC chip 10), leading to bigger slant angle of connecting segment 26, consequently IC chip 10 moves downward and buffer (or cushioning) for stress is provided.

On the contrary, in case the thermal coefficient of package frame 20 is smaller than IC chip 10, and IC chip 10 generates heat when operating, IC chip 10 will expand outward more than package frame 20 then (magnitude of expansion size of IC chip 10 is bigger than that of package frame 20), resulting in bigger slant angle of connecting segment 26 connecting inner lead 14 and outer lead 24, consequently leading to moving of IC chip 10 downward, and buffer (or cushioning) for stress; when IC chip 10 cools as a result of being idle (not operating), IC chip 10 shrinks inward more than package frame 20 then (magnitude of shrinkage of IC chip 10 is bigger than that of package frame 20), leading to smaller slant angle of connecting segment 26, consequently IC chip 10 moves upward and buffer (or cushioning) for stress is provided.

It is clear now that the IC package structure based on the invention and illustrated above can realize the following advantages over conventional arts:

1. package frame 20 of fixed size can be used for IC chip 10 of various sizes, resulting in IC package of just one size, leading to lower cost for fixture as well as production and application.
2. package frame 20 of accurate size enables easy positioning of automatic machinery for assembly process.
3. package frame 20 with surface processed for insulation can effectively lower the induction of outer lead 24.
4. package frame 20 of high thermal conductivity can effectively dissipate the power generated by IC chip 10, leading to high reliability of IC chip 10.

In conclusion, the IC package structure based on the invention has never been found up to now. It can realize some significant practical efficacy as well as better performance progress/application flexibility/environmental adaptability compared with conventional arts.

While the invention has been described in terms of what are presently considered to be the most practical and preferred embodiments, it is to be understood that the invention is not limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A chip scale package for packaging an IC chip, comprising:

an IC chip having a top surface, a bottom surface, and side surfaces extending between said top and bottom surfaces, at least a pair of spaced bonding points being disposed on said top surface of said IC chip;

a package frame having opposite side walls, each extending along a respective one of said side surfaces of said IC chip, said package frame further having bottom beams extending beneath said bottom surface of said IC chip from a lower portion of said side walls of said package frame, said side walls of said package frame having respective upper portions extending above said top surface of said IC chip, a first gap being defined between said side surfaces of said IC chip and said side walls of said package frame, and a second gap being defined between said bottom surface of said IC chip and said bottom beams of said package frame;

at least a pair of substantially identical leads electrically coupled to respective said bonding points, and extending therefrom in opposite directions, each of said leads having:

an inner lead portion attached to said top surface of said IC chip, an outer lead portion bent to follow a contour of outside surface of a respective one of said side walls and said bottom beams of said package frame, and a connecting segment coupled between said inner lead portion and said outer lead portion and extending in slanted mutual relationship thereto between substantially said top surface of said IC chip and said upper portion of said side walls of said package frame, an angle being formed between said connecting segment and said side walls of said package frame;

said angle and said first and second gaps defined between said IC chip and said package frame changing in response to induced stress, thereby cushioning said stress.

2. The chip scale package according to claim 1, wherein said connecting segment is connected to a respective one of said pair of bonding points through said inner lead.

3. The chip scale package according to claim 2, wherein said connecting segment is further connected to said respective one of said pair of bonding points through a bonding wire.

4. The chip scale package according to claim 1, wherein said package frame is made of electrically conductive material provided with electrical insulation on a surface thereof to thereby lower induction of said outer lead portion.

5. The chip scale package according to claim 1, wherein said package frame is made of a material having high heat dissipation capability to thereby dissipate the heat generated by said IC chip.

6. The chip scale package according to claim 1, further including a hook member extending at a respective end of said outer lead portion and projected towards said bottom surface of said IC chip, said hook member preventing said package frame from displacement beyond an assigned region.

7. The chip scale package according to claim 1, wherein magnitudes of said first and second gaps and said angle are in such a range that a stress caused by a difference in coefficient of thermal expansion between said IC chip and said package frame can be cushioned.

* * * * *